US009177615B2

(12) United States Patent
Boucard

(10) Patent No.: US 9,177,615 B2
(45) Date of Patent: Nov. 3, 2015

(54) POWER DISCONNECT UNIT FOR USE IN DATA TRANSPORT TOPOLOGY OF NETWORK ON CHIP DESIGN HAVING ASYNCHRONOUS CLOCK DOMAIN ADAPTER SENDER AND RECEIVER EACH AT A SEPARATE POWER DOMAIN

(75) Inventor: Philippe Boucard, Le Chesnay (FR)

(73) Assignee: Qualcomm Technologies, Inc., San Diego, CA (US)

( * ) Notice: Subject to any disclaimer, the term of this patent is extended or adjusted under 35 U.S.C. 154(b) by 536 days.

(21) Appl. No.: 13/543,728

(22) Filed: Jul. 6, 2012

(65) Prior Publication Data
US 2013/0009695 A1    Jan. 10, 2013

Related U.S. Application Data

(60) Provisional application No. 61/504,948, filed on Jul. 6, 2011.

(51) Int. Cl.
*G06F 1/00* (2006.01)
*G11C 5/14* (2006.01)
*G06F 1/32* (2006.01)

(52) U.S. Cl.
CPC ............... *G11C 5/14* (2013.01); *G06F 1/3203* (2013.01); *Y02B 60/1217* (2013.01); *Y02B 60/1221* (2013.01); *Y02B 60/1278* (2013.01)

(58) Field of Classification Search
CPC ........... Y02B 60/1217; Y02B 60/1221; Y02B 60/1278; G11C 5/14
See application file for complete search history.

(56) References Cited

U.S. PATENT DOCUMENTS

| | | | |
|---|---|---|---|
| 6,161,160 A * | 12/2000 | Niu et al. ..................... | 710/310 |
| 7,511,535 B2 | 3/2009 | Chakraborty et al. | |
| 2002/0085008 A1 * | 7/2002 | Jain et al. ..................... | 345/520 |
| 2008/0313580 A1 * | 12/2008 | Anand et al. .................. | 716/3 |
| 2010/0271084 A1 * | 10/2010 | Basto et al. ................... | 327/141 |
| 2011/0161691 A1 * | 6/2011 | Tatsumi et al. ............... | 713/300 |
| 2011/0202788 A1 * | 8/2011 | Hesse et al. .................. | 713/600 |

* cited by examiner

*Primary Examiner* — Thomas Lee
*Assistant Examiner* — Zhipeng Wang
(74) *Attorney, Agent, or Firm* — Muncy, Geissler, Olds & Lowe, P.C.

(57) ABSTRACT

A power disconnect unit within a data transport topology of a NoC includes an asynchronous clock domain adapter unit inserted between a master side manager unit and a slave side manager unit. This configuration allows for the master and slave side managers of the power disconnect unit to be placed physically far apart on the chip, relieving the need to route long power rail signals on the chip. A response data path and associated asynchronous clock domain adapter unit is optionally included on the chip. A path to bypass the asynchronous clock domain adapter units is optionally included on the chip to enable a fully synchronous mode of operation without the data latency cost of the asynchronous adapter unit.

19 Claims, 11 Drawing Sheets

POWER DISCONNECT UNIT FOR USE IN DATA TRANSPORT TOPOLOGY OF NETWORK ON CHIP DESIGN HAVING ASYNCHRONOUS CLOCK DOMAIN ADAPTER SENDER AND RECEIVER EACH AT A SEPARATE POWER DOMAIN

CROSS-REFERENCE TO RELATED APPLICATION

This application claims priority to U.S. Provisional Patent Application No. 61/504,948, entitled "Asynchronous Power Disconnect," filed on Jul. 6, 2011, the entire contents of which are incorporated herein by reference.

TECHNICAL FIELD

The disclosed subject matter is generally related to network on chip (NoC) design.

BACKGROUND

One valuable feature (among many others) of modern network-on-chips (NoCs) is the ability to run part of the network at a first clock frequency and part of the network at a second clock frequency. This allows part of the network with high data transfer bandwidth requirements to run fast while other parts run more slowly, easing the timing closure challenge for engineers and electronic design automation (EDA) tools. Separate clock domains also allow parts of a chip to run at different frequencies depending on the data processing requirements, using a slower clock frequency to save dynamic power while data processing requirements are relatively low. Separate clock domains are also useful when parts of the network are a significant distance apart on the chip because clock tree insertion and balancing across significant distances is difficult. Allowing parts of the NoC to run just with localized clocks avoids that difficulty.

A network on chip employs a unit of logic known as a clock domain adapter to transfer data correctly between logic in two different clock domains. In particular, a clock domain adapter for transferring data between asynchronous clock domains is known as an asynchronous clock domain adapter. The logic of an asynchronous clock domain adapter generally comprises two portions: a sender that sends data and a receiver that receives data.

FIG. 1 is a simplified block diagram illustrating an example asynchronous clock domain adapter unit 100. The adapter unit 100 includes circular buffer 102, multiplexer 104, write control 106 and read control 108. Data sender logic is clocked in a sending clock domain while data receiver logic is clocked in a receiving clock domain. In adapter unit 100, the signals that pass between the sender and receiver include data elements in circular buffer 102, also known as a bisynchronous first-in-first-out (FIFO) buffer. The circular buffer 102 can be coupled to the multiplexer 104. The multiplexer 104 outputs data elements from the circular buffer 102 based on a read pointer (RdPtr) value. The write control unit 106 is configured to control a Gray coded write data counter for generating a write count (WrCnt). The read control unit 108 is configured for controlling a Gray coded read data counter 106 for generating a read count (RdCnt) and the read pointer (RdPtr).

Another valuable feature of an asynchronous clock domain adapter is the ability to power off part of the network-on-chip without causing functional failure or data loss or corruption for the rest of the chip. The ability to power off part of a chip is useful for saving power. Power-off is typically used when a processing function is not required. For example, a video codec intellectual property (IP) block might be powered off in a mobile device application processor when no video is being played.

The set of logic that is powered on or off together is known as a power domain. Within a wake-up sequence, some (usually most) of the logic in the power domain is reset to a known state. This enables the engagement of an appropriate data transfer protocol from a predictable state of operation. In conventional power disconnect units the logic on both sides (the already-awake and the waking-up) run on a common clock. This ensures that one side does not take on an unpredictable state while the other side is beginning to engage the communication protocol.

In conventional NoCs, an asynchronous clock domain adapter sender and an asynchronous clock domain adapter receiver can reside in the same power domain. If one is running while the other is powered off the adapter unit can take on an unpredictable state, leading to data loss or instability. Specifically, when an asynchronous clock domain adapter unit is powered on and reset, the state of WrCnt in the sender and the state of WrCnt in the synchronization registers of the receiver are both the same and the state of RdCnt in the receiver and RdCnt in the synchronization registers of the sender are the same and RdPtr is known to the write control unit 106. If one wakes up and is reset while the other is still running they would tend to reset with unsynchronized pointers, leading to data being sent twice or data being lost or other unpredictable behavior.

In other words, an asynchronous clock domain adapter unit and a power disconnect unit may operate correctly in series if there is no asynchronous clock domain adapter between the master and slave sides of a power disconnect unit and there is no power disconnect unit between the asynchronous clock domain adapter sender and the asynchronous clock domain adapter receiver.

When laying out a chip it is often desirable to have logic within a single clock domain localized within a common region. This is because it is difficult to insert and balance a clock tree when the clock nets extend over significant distances. It is also often desirable to have logic within a single power domain localized within a common region. This is because it is difficult to comingle the wiring carrying power from many different power supplies within a shared region of the chip. Basically, localization is valuable, and increasingly so as modern chips are designed with increasingly many power domains and increasingly many clock domains.

Furthermore, it is valuable to have a small number of network-on-chips. This is because the complexity of transferring data through a network-on-chip occurs at the edges of the network where packets are encoded and decoded and all of the interconnecting logic is relatively simple. The fewer network-on-chips, the less logic overhead is required for encoding and decoding packets. Such logic is expensive in silicon die area, logic path delay, and clock cycles of latency for transferring data. As a result, network-on-chips must span multiple, and usually many, clock domains and power domains.

FIG. 2 illustrates a network-on-chip with a physical distance between sides of a power disconnect unit downstream of an asynchronous clock domain adapter unit. An impediment to localization arises when an asynchronous clock domain adapter and a power disconnect unit are placed in series within a data link in a network-on-chip. FIG. 2 shows an initiator IN that request a write transaction to send data to a target TA through an asynchronous clock domain adapter sender SE REQ in the request path, an asynchronous clock domain adapter receiver RE REQ in the request path, a downstream disconnect unit master side manager MA, and a disconnect unit slave side manager SL. Response data is returned through SL and MA and an asynchronous clock domain adapter sender SE RSP and an asynchronous clock domain adapter receiver RE RSP. The physical placement of the units is such that MA and SL are far apart (indicated by the dashed line). In this configuration the units have good localization in the power domains but have poor localization in clock domains. The clock signal of clock domain Y spans the significant distance between the logic of MA and SL. This configuration challenges clock tree insertion.

FIG. 3 illustrates a network-on-chip with a physical distance between senders and receivers of asynchronous clock domain adapter units upstream of a power disconnect unit. More particularly, FIG. 3 shows a configuration of the same components but with MA and SL close together and with SE REQ separated from RE REQ by a significant distance and SE RSP separated from RE RSP by a significant distance. This configuration is preferable to that of FIG. 2 for clock tree insertion because no clock signals spans a significant distance. However, this configuration requires the power supply of power domain A to span the significant distance, which challenges supply rail routing.

FIG. 4 illustrates a network-on-chip with a distance between senders and receivers of asynchronous clock domain adapter units downstream of a power disconnect unit. More particularly, FIG. 4 shows a configuration in which the power disconnect unit is upstream of the asynchronous clock domain adapters in the request data flow. The asynchronous clock domain adapter unit senders and receivers are placed at a significant distance. This configuration suffers a supply rail routing challenge.

FIG. 5 is a network-on-chip with a distance between sides of a power disconnect unit upstream of an asynchronous clock domain adapter unit. More particularly, FIG. 5 shows a configuration with the same components but with the power disconnect unit master side manager and slave side manager placed at a significant distance. This configuration suffers a clock tree insertion challenge.

Some network-on-chips do not include a response path. For such configurations FIGS. 2-5 are applicable, but without the SE RSP and RE RSP components and no response data path.

FIG. 6 illustrates an example power disconnect unit. Request data from master to slave and response data from slave to master are connected as in any system of a single power domain, except that they are separated by power isolation cells. The SocketConn signal indicates to the slave that the master is connected and can send traffic. The SlvRdy signal indicates to the master that the slave can be safely powered off without the loss of transactions in flight. SocketConn and SlvRdy are also connected between master and slave through power isolation cells. The clock signal is generated in the power-on domain and connected to the power-off domain through an isolation cell.

The disclosed invention pertains, particularly, to networks of clocked logic. A unit with an ability to correctly transfer data between logic in a first clock domain and logic in a second clock domain is known as an asynchronous clock domain adapter. This is because the two clocks have no synchronized relationship to each other. The invention does not pertain to networks of asynchronous logic, also known as self-timed logic. Such networks transfer data without a corresponding clock signal.

SUMMARY

The disclosed implementations are directed to a power disconnect module that integrates an asynchronous clock domain crossing. In some implementations, a power disconnect unit within a data transport topology of a NoC includes an asynchronous clock domain adapter unit inserted between a master side manager unit and a slave side manager unit. This configuration allows for the master and slave side managers of the power disconnect unit to be placed physically far apart on the chip, relieving the need to route long power rail signals on the chip. A response data path and associated asynchronous clock domain adapter unit is optionally included on the chip. A path to bypass the asynchronous clock domain adapter units is optionally included on the chip to enable a fully synchronous mode of operation without the data latency cost of the asynchronous adapter unit.

DETAILED DESCRIPTION

A network-on-chip is disclosed that includes an asynchronous clock domain adapter unit inserted between a master side manager and a slave side manager of a power disconnect unit. An example of such a network-on-chip is shown in FIG. 7.

Figure 1:
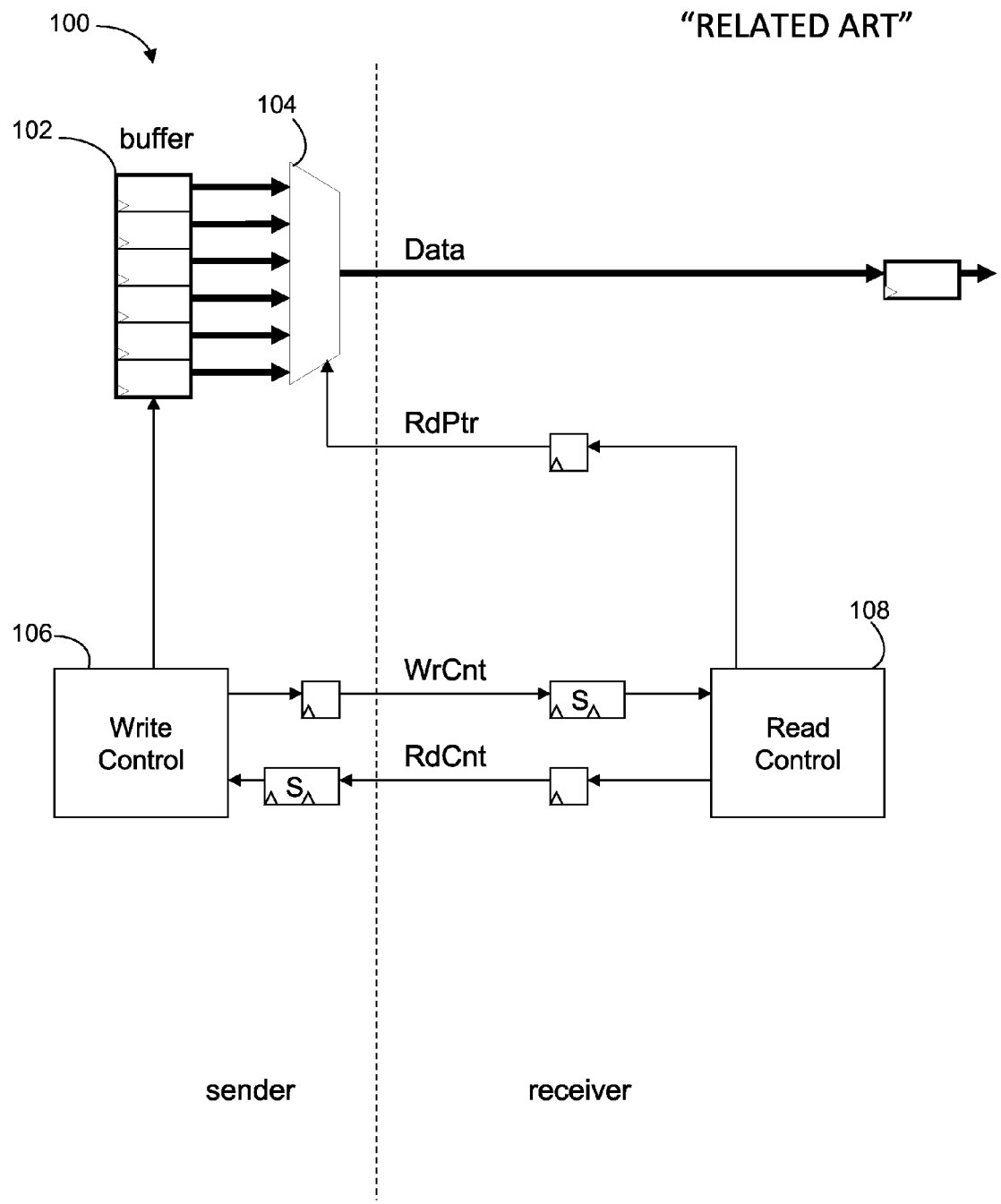
FIG. 1 illustrates an asynchronous clock domain adapter unit.
Figure 2:
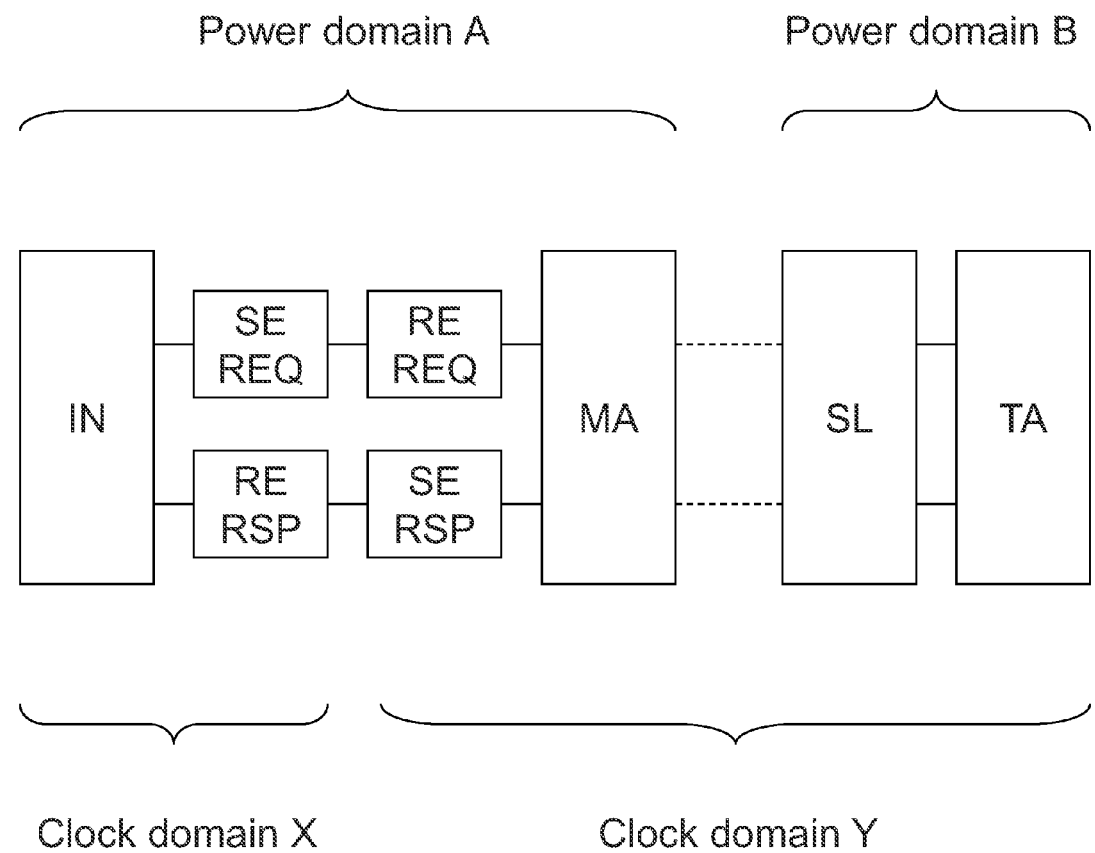
FIG. 2 illustrates a power disconnect unit with a physical distance between sides of a power disconnect unit downstream of an asynchronous clock domain adapter unit.
Figure 3:
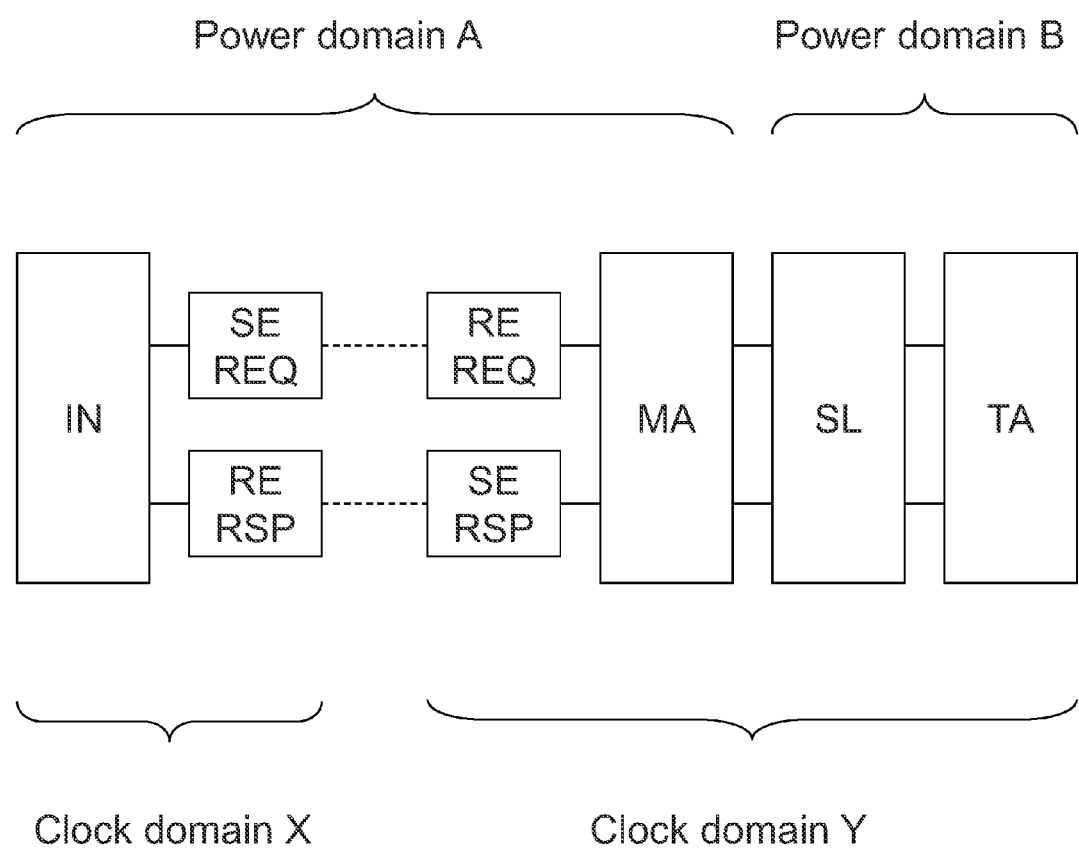
FIG. 3 illustrates a power disconnect unit with a physical distance between senders and receivers of asynchronous clock domain adapter units upstream of a power disconnect unit.
Figure 4:
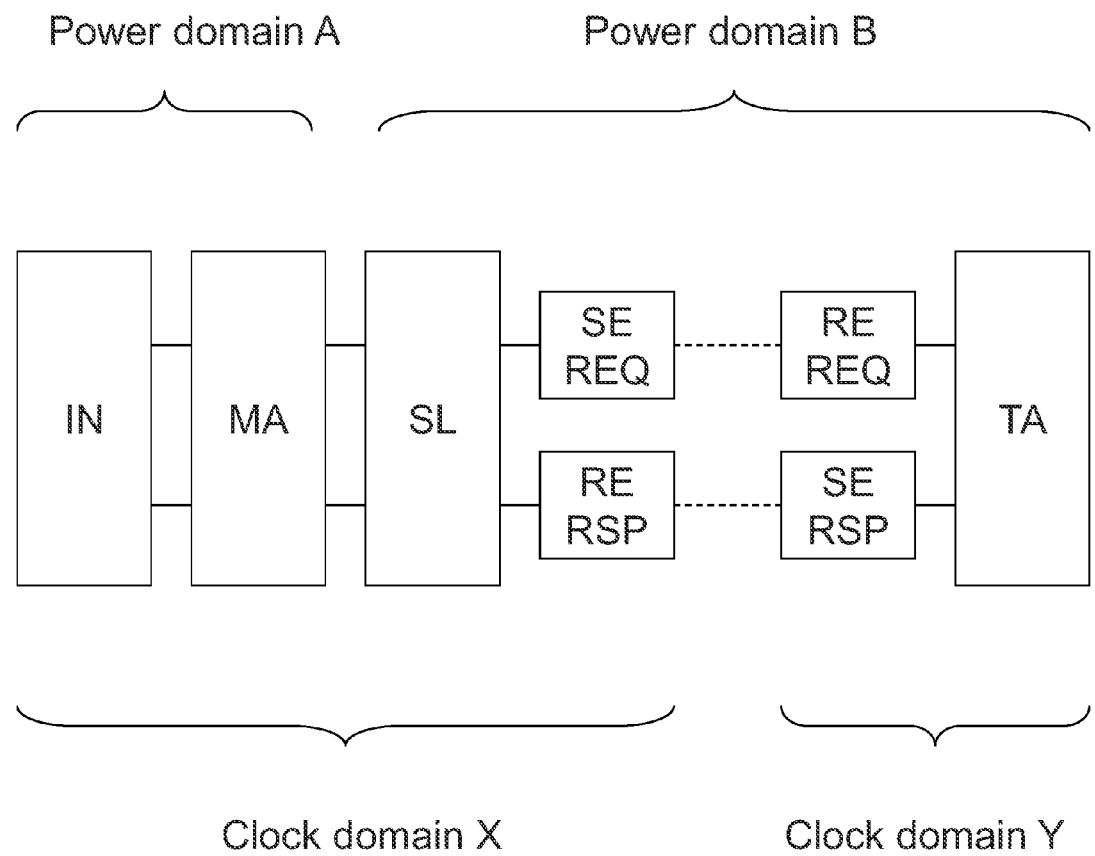
FIG. 4 illustrates a power disconnect unit with a physical distance between senders and receivers of asynchronous clock domain adapter units downstream of a power disconnect unit.
Figure 5:
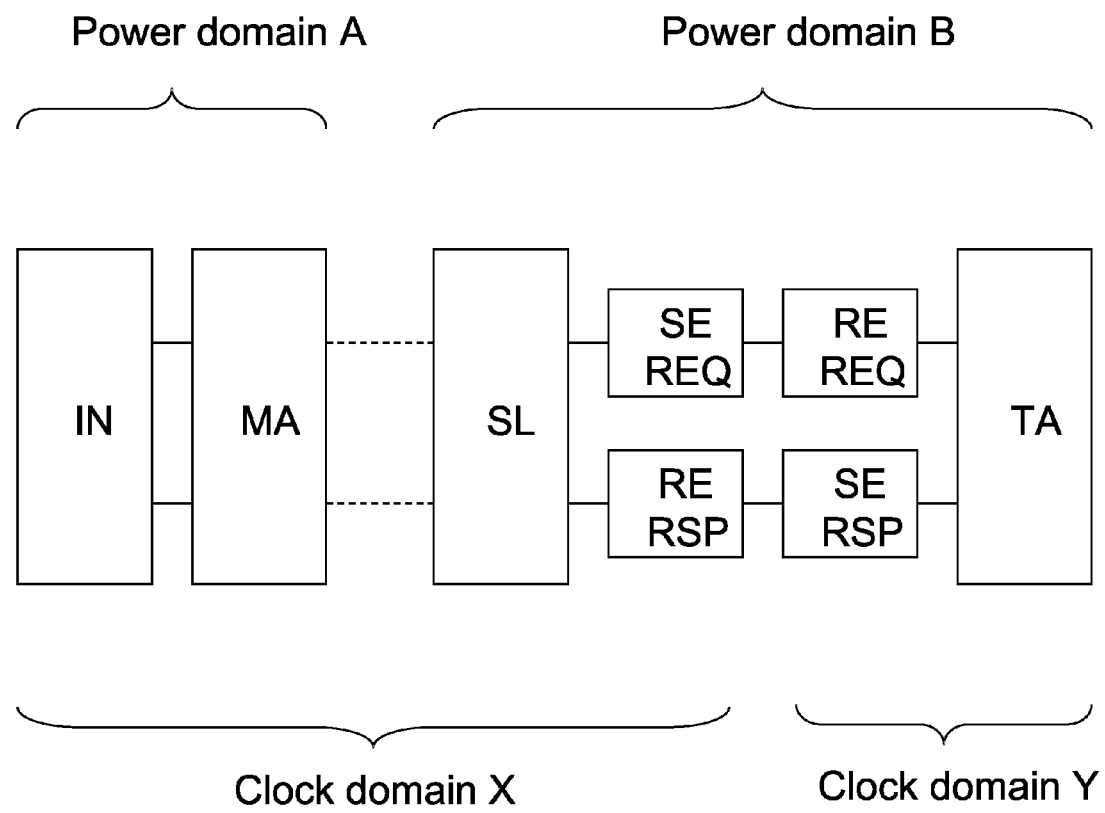
FIG. 5 illustrates a power disconnect unit with a physical distance between sides of a power disconnect unit upstream of an asynchronous clock domain adapter unit.
Figure 6:
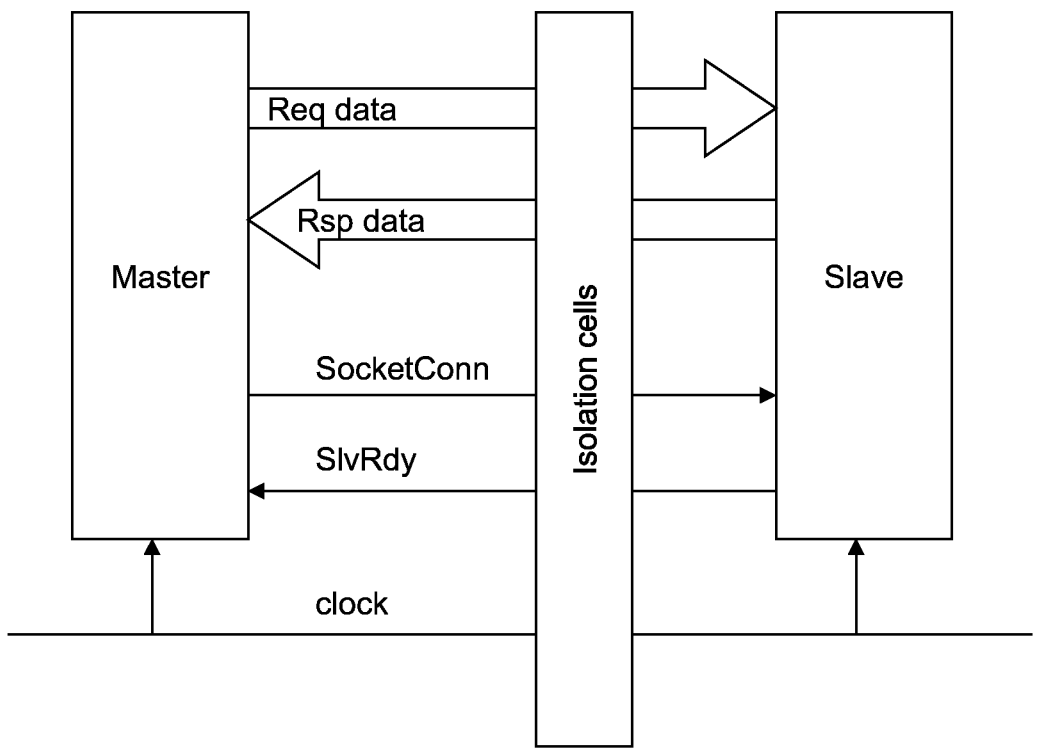
FIG. 6 illustrates a conventional power disconnect unit.
Figure 7:
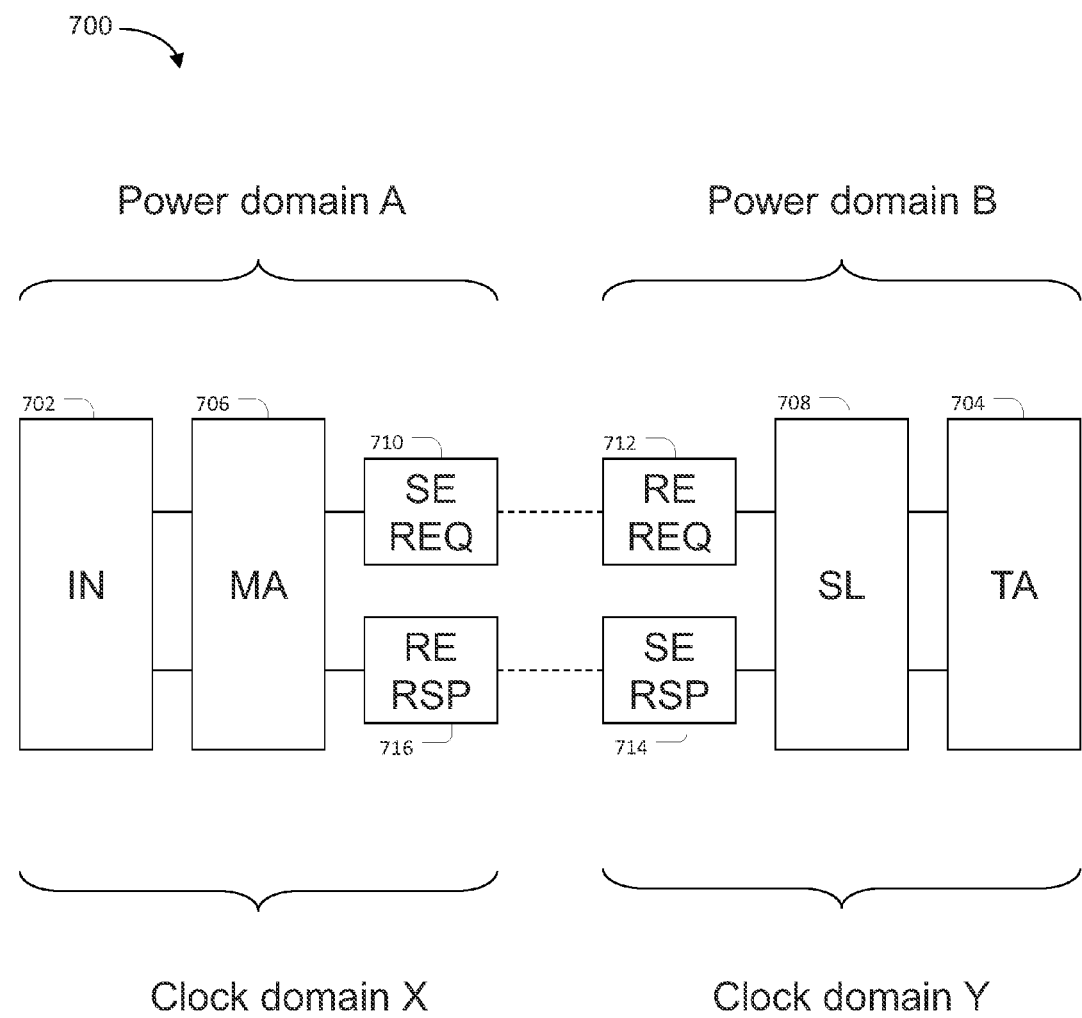
FIG. 7 is an example power disconnect unit with a physical distance between the sides of a power disconnect unit and a distance between the senders and receivers of asynchronous clock domain adapter units.

FIG. 7 is an example power disconnect unit with a physical distance between the sides of a power disconnect unit and a physical distance between the senders and receivers of asynchronous clock domain adapter units.

In some implementations, a power disconnect unit 700 can include an initiator 702 (IN) connected to a target 704 (TA) through a request datapath and a response datapath. IN and TA can be independently powered on and off within power domains A and B respectively. The power disconnect protocol can be between a master side manager 706 (MA) and a slave side manager 708 (SL). In this example, within the power disconnect unit 700 the request datapath passes through an upstream sender 710 (SE REQ) and a downstream receiver 712 (RE REQ) of an asynchronous clock domain adapter unit. Likewise, within the power disconnect unit 700 the response datapath passes through a sender 714 (SE RSP) and a receiver 716 (RE RSP) of an asynchronous clock domain adapter unit. The upstream and downstream components are physically placed at a significant distance apart (indicated by the dashed lines). The upstream components can operate within a single power domain A and clock domain X. The downstream components can operate within a single power domain B and clock domain Y. As a result, no clock signal passes the significant distance between components and no power rail wires are routed the significant distance between components. As a result, the logic of all units is localized, avoiding the challenges of significant distance clock tree insertion and significant distance power rail routing.

Figure 8:
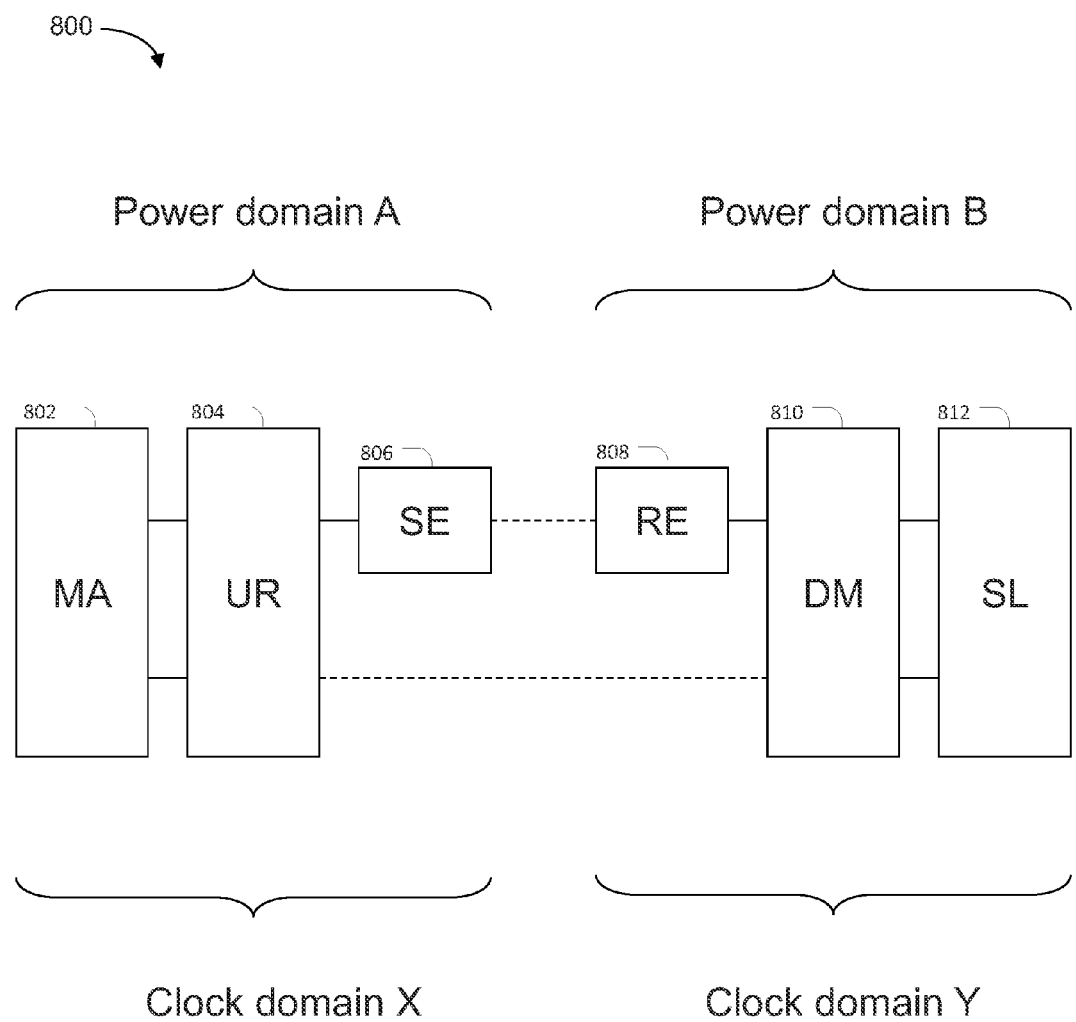
FIG. 8 illustrates an example power disconnect unit with a mode to bypass the asynchronous clock domain adapter unit.

FIG. 8 illustrates an example power disconnect unit with a mode to bypass the asynchronous clock domain adapter unit. More particularly, FIG. 8 shows another example power disconnect unit 800 comprising a request path but no response path. A master side manager 802 (MA) sends data through an upstream router 804 (UR) that, in one mode, sends data through a sender 806 (SE) and a receiver 808 (RE) of an asynchronous clock domain adapter to a downstream multiplexer 810 (DM) that passes the data to slave side manager 812 (SL) and, in another mode, sends data directly through DM 810 to SL 812, bypassing SE 806 and RE 808. Such an embodiment allows the chip to avoid data delay inherent to an asynchronous clock domain adapter unit when running in a mode in which clock domain X and clock domain Y are synchronized.

Figure 9:
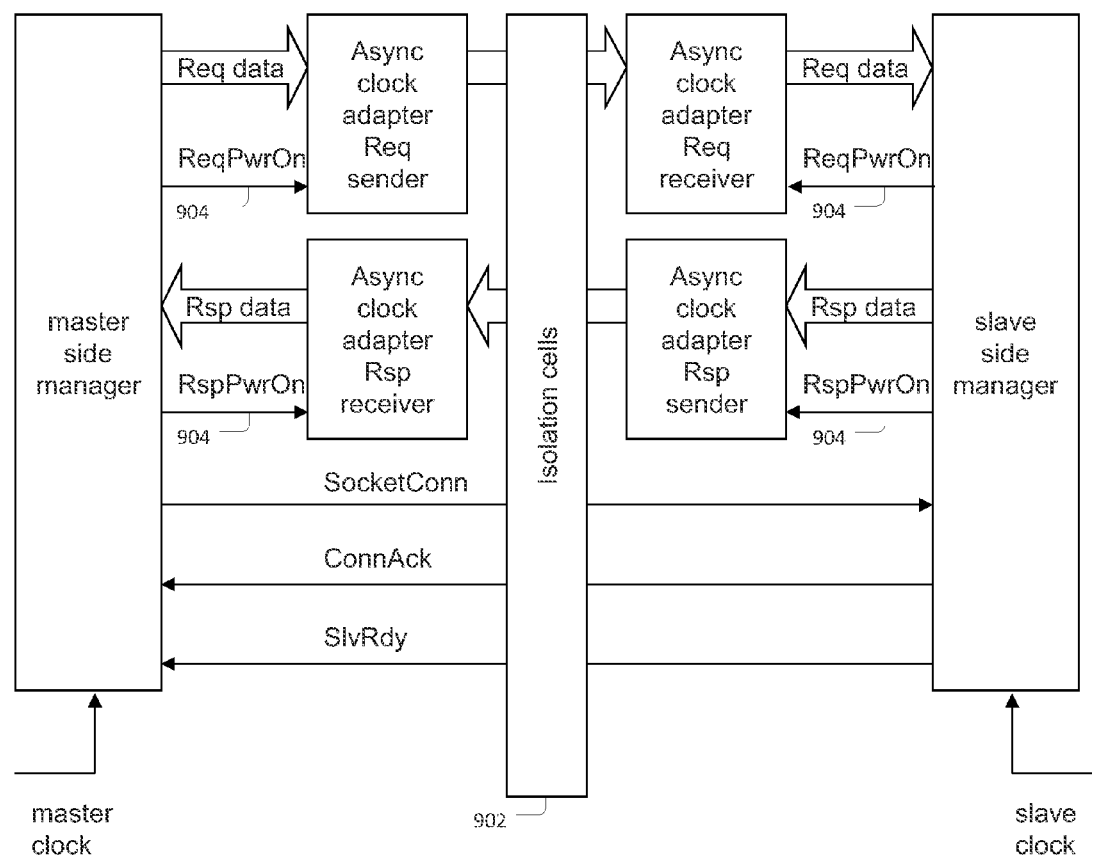
FIG. 9 illustrates an example power disconnect unit that includes two asynchronous clock domain adapter units.

FIG. 9 illustrates an example power disconnect unit that includes two asynchronous clock domain adapter units. More particularly, FIG. 9 shows a more detailed diagram of the example implementation of FIG. 7. In FIG. 9, request data from the power disconnect unit master side manager 706 to the slave side manager 708 and response data from slave side manager 708 to master side manager 706 are connected through asynchronous clock domain adapter unit senders 710 and receivers 712, except that they are separated by power isolation cells 902.

In this example, the SocketConn signal indicates to the slave that the master is connected and can send traffic. The ConnAck signal is the resynchronized copy of SocketConn, plus 2 cycles. It is resynchronized in the master side manager 706 and resets the asynchronous clock domain adapter sender 710, once the power disconnect unit slave side manager 708 has done the same on the asynchronous clock domain adapter receiver 712. The SlvRdy signal indicates to the master side manager that the slave side manager can be safely powered off without the loss of transactions in flight. SocketConn, ConnAck, and SlvRdy are also connected between the master side manager 706 and slave side manager 708 through power isolation cells 902. The clock signals on the master side and slave side are generated separately (and physically distant) in their respective power domains. The asynchronous clock domain adapter senders 710 and 714 and receivers 712 and 716 each receive a power on signal 904 that, when asserted, resets the component logic. The master side manager 706 generates ReqPwrOn to reset the request path asynchronous clock domain adapter sender 710 and generates RspPwrOn to reset the response path asynchronous clock domain adapter receiver 712. The slave side manager 708 generates ReqPwrOn to reset the request path asynchronous clock domain adapter receiver 712 and generates RspPwrOn to reset the response path asynchronous clock domain adapter sender 714.

Figure 10:
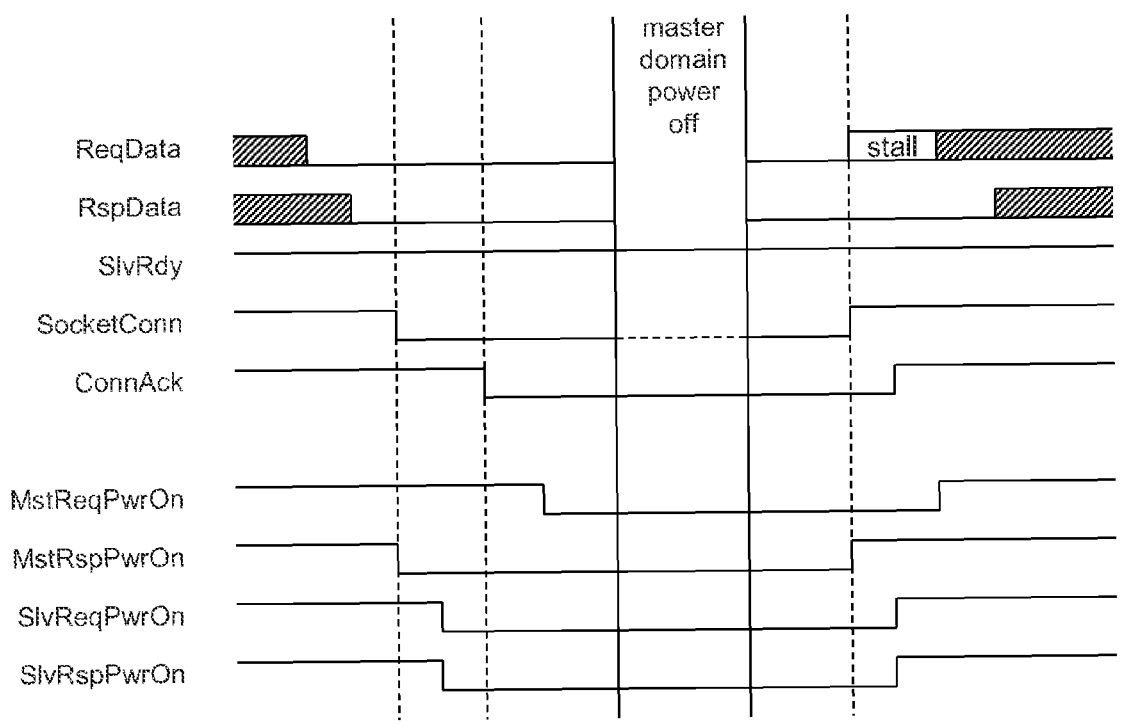
FIG. 10 illustrates an example timing diagram for a master domain power off and power on sequence of a power disconnect unit engaging data transfer protocol.

FIG. 10 is an example timing diagram for a master domain power off and power on sequence of a power disconnect unit engaging a data transfer protocol. Referring to the implementation shown in FIG. 9, after the system level power manager requests power-off of the master power domain, the following steps occur:

1. The power disconnect unit master side manager fences new requests. The process of fencing includes stalling the request path or responding with an error signal;

2. The power disconnect unit master side manager waits until it has drained (received all pending) responses from the power disconnect unit slave side manager for all pending requests;

3. The power disconnect unit master side manager deasserts SocketConn. It also disables the response asynchronous clock domain adapter receiver by deasserting MstRspPwrOn. This prevents spurious transmissions in the response path caused by the SE RSP reset that will occur later;

4. The power disconnect unit slave side manager disables the response asynchronous clock domain adapter sender by deasserting SlvRspPwrOn. This resets the SE RSP unit, including RdCnt and the WrCnt synchronization registers. The power disconnect unit slave side manager also disables the request asynchronous clock domain adapter receiver by deasserting SlvReqPwrOn. This prevents spurious transmissions in the request path caused by the SE REQ reset that will occur later;

5. The power disconnect unit slave side manager deasserts ConnAck to indicate that it is ready for the power disconnect;

6. The power disconnect unit master side manager disables the request asynchronous clock domain adapter sender by deasserting MstReqPwrOn. This resets the SE REQ unit, including WrCnt and the RdCnt synchronization registers; and 7. The system level power manager disconnects the power supply from the master domain. SocketConn remains undriven while SlvRdy and ConnAck are held by the power disconnect unit slave side manager.

When the system level power manager requests wake-up of the master power domain, it connects power and deasserts reset. The following steps occur for the wake-up:

1. The power disconnect unit master side manager asserts SocketConn. It also resets and enables the response asynchronous clock domain adapter receiver by asserting MstRspPwrOn. At this step, the power disconnect unit master side manager is able to receive request packets, but will assert backpressure upstream to stall traffic;

2. The power disconnect unit slave side manager receives SocketConn and asserts ConnAck. It also resets and enables the response asynchronous clock adapter sender by asserting SlvRspPwrOn. It also resets and enables the request asynchronous clock adapter receiver by asserting SlvReqPwrOn;

3. The power disconnect unit master side manager receives ConnAck and enables and resets the request asynchronous clock domain adapter sender by asserting MstReqPwrOn. It also stops stalling and request data transfers and begins sending the requests through the request asynchronous clock domain adapter unit; and 4. The power disconnect unit slave side manager receives data transfer responses and passes them through the asynchronous clock domain adapter receiver to the power disconnect unit master side manager.

Figure 11:
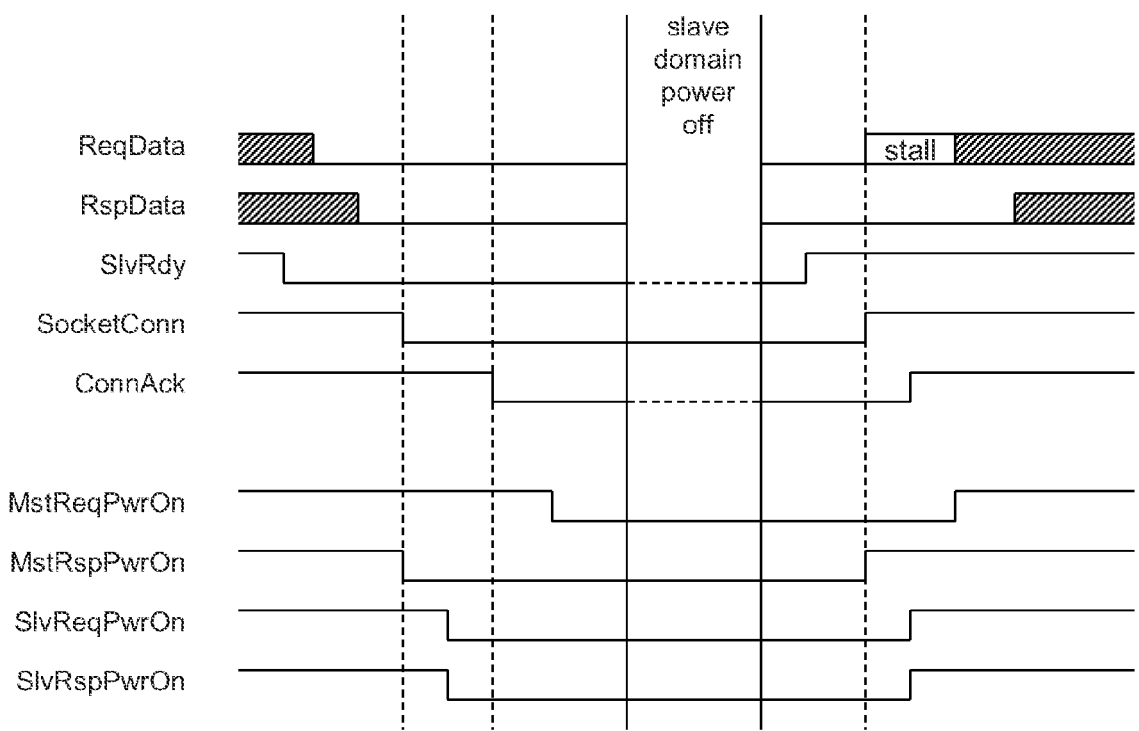
FIG. 11 illustrates an example timing diagram for a slave domain power off and power on sequence of a power disconnect unit engaging data transfer protocol.

FIG. 11 is an example timing diagram for a slave domain power off and power on sequence of a power disconnect unit engaging data transfer protocol. When the system level power manager requests power-off and power-on of the slave domain, the steps are the same as for power-off and power-on of the master domain except that, as shown in FIG. 11, the power disconnect unit slave side manager can signal to the power disconnect unit master side manager that it wants to power off and wants to power on. This can be done with the SlvRdy signal before step 1 in each procedure above. Also, when the slave domain is powered off, the power disconnect unit master side manager holds SocketConn and SlvRdy and ConnAck remain undriven.

What is claimed is:

1. A power disconnect unit, comprising:
   a disconnect unit master side manager, configured to receive requests from an initiator;
   a request datapath coupled to the disconnect unit master side manager;
   a disconnect unit slave side manager, coupled to the request datapath,
   wherein the request datapath includes an asynchronous clock domain adapter sender, in series with an asynchronous clock domain adapter receiver,
   wherein the disconnect unit master side manager is configured to
      receive transaction requests from an initiator, and
      upon receiving a system power manager request for a power-off of a first power domain, to fence transaction requests received from the initiator wherein fencing a request includes a stalling of the request datapath, or responding to the request by sending an error signal to the initiator, and
   wherein the request datapath is configured to connect a request data from the disconnect unit master side manager to the disconnect unit slave side manager through the asynchronous clock domain adapter sender and through the asynchronous clock domain adapter receiver,
   wherein the disconnect unit master side manager and the asynchronous clock domain adapter sender are in the first power domain, and wherein the disconnect unit slave side manager and the asynchronous clock domain adapter receiver are in a second power domain.

2. The power disconnect unit of claim 1, wherein the request datapath is reconfigurable to couple the disconnect unit master side manager to the disconnect unit slave side manager without passing through the asynchronous clock domain adapter sender or the asynchronous clock domain adapter receiver.

3. The power disconnect unit of claim 2, wherein the response datapath is reconfigurable to couple the disconnect unit slave side manager to the disconnect unit master side manager without passing through the second asynchronous clock domain adapter sender or the second asynchronous clock domain receiver.

4. A method of powering-off a power domain unit, comprising:
   connecting requests from an initiator to a target, through a master side manager, a first asynchronous clock domain adapter sender, a first asynchronous clock domain adapter receiver, and a slave side manager;
   connecting responses to the requests, from the target to the initiator, through the slave side manager, a second asynchronous clock domain adapter sender, a second asynchronous clock domain adapter receiver, and the master side manager;
   receiving a request to power off a first power domain;
   upon receiving the request to power off the first power domain,
      fencing new requests received from the initiator, and
      draining pending responses to the requests from the slave side manager, wherein fencing new requests received from the initiator includes sending an error to the initiator, or stalling the request datapath;
   upon draining pending responses to the requests, resetting the second asynchronous clock domain adapter sender; and turning off power to the first power domain,
   wherein the master side manager, the first asynchronous clock domain adapter sender and the second asynchronous clock domain adapter receiver are in the first power domain, and wherein the slave side manager, the second asynchronous clock domain adapter sender and the first asynchronous clock domain adapter receiver are in a second power domain.

5. The method of claim 4, wherein the second asynchronous clock domain adapter sender is in the second domain, wherein the second power domain remains powered on after the first power domain is powered off.

6. The method of claim 4, wherein the step of resetting the second an asynchronous clock domain adapter sender comprises:
   resetting a write counter register; and
   resetting a read counter register.

7. A method of powering-off a power domain unit, comprising:
   connecting requests from an initiator to a target, through a master side manager, a first asynchronous clock domain adapter sender, a first asynchronous clock domain adapter receiver, and a slave side manager;
   connecting responses to the requests, from the target to the initiator, through the slave side manager, a second asynchronous clock domain adapter sender, a second asynchronous clock domain adapter receiver, and the master side manager;
   receiving a request to power off a first power domain;
   upon receiving the request to power off the first power domain,
      fencing new requests received from the initiator, and
      draining pending responses to the requests from the slave side manager, wherein fencing new requests received from the initiator includes sending an error to the initiator, or stalling the request datapath;
   upon draining pending responses to the requests, resetting the first asynchronous clock domain adapter sender; and
   turning off power to the first power domain,
   wherein the master side manager, the first asynchronous clock domain adapter sender and the second asynchronous clock domain adapter receiver are in the first power domain, and wherein the slave side manager, the first asynchronous clock domain adapter receiver and the second asynchronous clock domain adapter sender are in a second power domain.

8. The method of claim 7, wherein the second power domain remains powered on after the first power domain is powered off.

9. The method of claim 7, wherein the step of resetting the first asynchronous clock domain adapter sender comprises:
   resetting a write counter register; and
   resetting a read counter register.

10. A power disconnect unit, comprising:
    a master side manager, configured to receive requests from an initiator, wherein the master side manager is in a first power domain and in a first clock domain;
    a request datapath, comprising an asynchronous clock domain adapter sender and an asynchronous clock domain adapter receiver, configured to connect requests from the master side manager to a second power domain and to a second clock domain, wherein the asynchronous clock domain sender is in the first power domain, and the asynchronous clock domain adapter receiver is in the second power domain;

a slave side manager, in the second power domain and in the second clock domain, configured to connect requests from the request datapath to a target, and configured to receive, from the target, responses to the requests; and a response datapath, comprising an asynchronous clock domain adapter sender in the second power domain and an asynchronous clock domain adapter receiver in the first power domain, configured to connect, from the slave side manager to the master side manager, responses to the requests;

wherein the master side manager is configured to receive a request to power off the first power domain and, upon receiving the request to power off the first power domain, to fence new requests from the initiator, drain pending responses to the requests from the slave side manager, wherein to fence new requests from the initiator includes to send an error to the initiator, or to stall the request datapath, disable the asynchronous clock domain adapter receiver in the first power domain, cause the slave side manager to disable the asynchronous clock domain adapter receiver in the second power domain, and to disable and reset the asynchronous clock domain adapter sender in the second power domain, and disable the asynchronous clock domain adapter sender in the first power domain and reset the asynchronous clock domain adapter sender in the first power domain.

11. The power disconnect unit of claim 10, wherein the master side manager is further configured to receive a system level power manager request for wake-up and, in response, to assert a connection signal, to the slave side manager, enable and reset the asynchronous clock domain adapter receiver in the first power domain, and receive requests from the initiator and, in response, to assert a backpressure upstream to stall traffic.

12. The power disconnect unit of claim 11, wherein the slave side manager is further configured to receive the connection signal and, in response, to assert a connection acknowledge signal, to the master side manager, enable and reset the asynchronous clock domain adapter receiver in the second power domain, and enable and reset the asynchronous clock domain adapter sender in the second power domain.

13. The power disconnect unit of claim 12, wherein the master side manager is further configured to receive the connection acknowledge signal and, in response, to enable and reset the asynchronous clock domain adapter sender in the first power domain, and cease asserting backpressure upstream to cease stalling traffic.

14. The power disconnect unit of claim 1, wherein the asynchronous clock domain adapter sender is a first asynchronous clock domain adapter sender, wherein the asynchronous clock domain adapter receiver is a first asynchronous clock domain adapter receiver, and wherein the power disconnect unit further comprises:

a response datapath coupled to the disconnect slave side manager and to the disconnect master side manager, wherein the response datapath includes a second asynchronous clock domain adapter sender, in series with a second asynchronous clock domain adapter receiver, and wherein the response datapath is configured to connect a response data from the disconnect unit slave side manager to the disconnect unit master side manager through the second asynchronous clock domain adapter sender and through the second asynchronous clock domain adapter receiver.

15. The power disconnect unit of claim 14, wherein fencing a request includes a stalling of the request datapath, or responding to the request by a sending of an error signal to the initiator, or both.

16. The power disconnect unit of claim 14, wherein the second asynchronous clock domain adapter receiver is in the first power domain, and wherein the second asynchronous clock domain adapter sender is in the second power domain.

17. The power disconnect unit of claim 16, wherein the power disconnect unit master side manager is further configured to send to the power disconnect unit slave side manager a connection signal, wherein the connection signal indicates to the power disconnect unit slave side manager that the power disconnect unit master side manager is connected and can send a traffic, and wherein the disconnect unit master side manager is further configured to wait, after fencing the requests, for pending responses from the power disconnect slave side manager and, upon receiving all of the pending responses from the power disconnect unit slave side manager, to de-assert the connection signal, and disable the second asynchronous clock domain adapter receiver.

18. The power disconnect unit of claim 17, wherein the power disconnect unit slave side manager is further configured, in response to the de-asserting the connection signal, to disable the first asynchronous clock domain adapter receiver, disable and reset the second asynchronous clock domain sender, and de-assert the connection acknowledge signal.

19. The power disconnect unit of claim 18, wherein the master side manager is further configured, in response to the de-asserting of the connection acknowledge signal, to reset the first asynchronous clock domain adapter sender.

* * * * *